(12) United States Patent
Cho et al.

(10) Patent No.: US 7,838,384 B2
(45) Date of Patent: Nov. 23, 2010

(54) STRUCTURE FOR SYMMETRICAL CAPACITOR

(75) Inventors: Choongyeun Cho, Hopewell Junction, NY (US); Jonghae Kim, Fishkill, NY (US); Moon J. Kim, Wappingers Falls, NY (US); Jean-Olivier Plouchart, New York, NY (US); Robert E. Trzcinski, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 11/970,665

(22) Filed: Jan. 8, 2008

(65) Prior Publication Data

US 2008/0099880 A1 May 1, 2008

Related U.S. Application Data

(63) Continuation-in-part of application No. 11/436,251, filed on May 18, 2006, now abandoned.

(51) Int. Cl.
*H01L 21/20* (2006.01)
(52) U.S. Cl. .................. 438/396; 438/381; 257/532; 257/E21.008
(58) Field of Classification Search ............... 438/396, 438/381; 257/532, E21.008
See application file for complete search history.

(56) References Cited

U.S. PATENT DOCUMENTS 5,016,070 A  5/1991  Sundaresan ............... 357/23.6

(Continued)

FOREIGN PATENT DOCUMENTS

EP  0905792 A2  3/1999
EP  1435665 A2  7/2004

OTHER PUBLICATIONS

Jonghae Kim et al, "3-dimensional Vertical Parallel Plate Capacitors in an SOI CMOS Technology for Integrated RF Circuits", 2003 Symposium on VLSI Circuits, Digest of Technical Papers, Kyoto, Japan, Jun. 12-14, 2003, Symposium on VLSI Circuits, New York, NY, IEEE, US, Jun. 12, 2003, pp. 29-32, XP010651118.

(Continued)

*Primary Examiner*—Matthew E Warren
*Assistant Examiner*—John Lin
(74) *Attorney, Agent, or Firm*—Patrick J. Daugherty; Driggs, Hogg, Daugherty & Del Zoppo Co., LPA

(57) ABSTRACT

Methods, articles and design structures for capacitance circuits are provided disposing a lower vertical-native capacitor metal layer above a planar front-end-of-line semiconductor base substrate, planar metal bottom plates spaced a bottom plate distance from the base and top plates above the bottom plates spaced a top plate distance from the base defining metal-insulator-metal capacitors, top plate footprints disposed above the base substrate smaller than bottom plate footprints and exposing bottom plate remainder upper lateral connector surfaces; disposing parallel positive port and negative port upper vertical-native capacitor metal layers over and each connected to top plate and bottom plate upper remainder lateral connector surface. Moreover, electrical connecting of the first top plate and the second bottom plate to the positive port metal layer and of the second top plate and the first bottom to the negative port metal layer impart equal total negative port and positive port metal-insulator-metal capacitor extrinsic capacitance.

8 Claims, 9 Drawing Sheets

U.S. PATENT DOCUMENTS

| | | | | |
|---|---|---|---|---|
| 5,145,799 | A | | 9/1992 | Rodder .................. 437/47 |
| 5,208,597 | A | | 5/1993 | Early et al. |
| 5,208,725 | A | * | 5/1993 | Akcasu .................. 361/313 |
| 5,324,961 | A | | 6/1994 | Rodder .................. 257/69 |
| 5,583,359 | A | * | 12/1996 | Ng et al. .................. 257/306 |
| 5,619,055 | A | | 4/1997 | Meguro et al. .............. 257/369 |
| 5,808,223 | A | | 9/1998 | Kurakake et al. .............. 385/8 |
| 6,028,990 | A | | 2/2000 | Shahani et al. |
| 6,038,381 | A | * | 3/2000 | Munch et al. .................. 716/1 |
| 6,069,050 | A | | 5/2000 | Hou |
| 6,445,056 | B2 | * | 9/2002 | Nakashima .................. 257/532 |
| 6,621,111 | B2 | | 9/2003 | Hwang .................. 257/296 |
| 2004/0012911 | A1 | | 1/2004 | Lee et al. |
| 2006/0024905 | A1 | | 2/2006 | He et al. |
| 2006/0180895 | A1 | | 8/2006 | Chen et al. |

OTHER PUBLICATIONS

Jonghae Kim et al, "Design and Manufacturability Aspect of SOI CMOS RFICs" Custom Integrated Circuits Conference, 2004, Proceedings of the IEEE 2004 Orlando, FL, USA Oct. 3-6, 2004, Piscataway, NJ, USA, IEEE, Oct. 3, 2004 pp. 541-548, XP010742374.

* cited by examiner

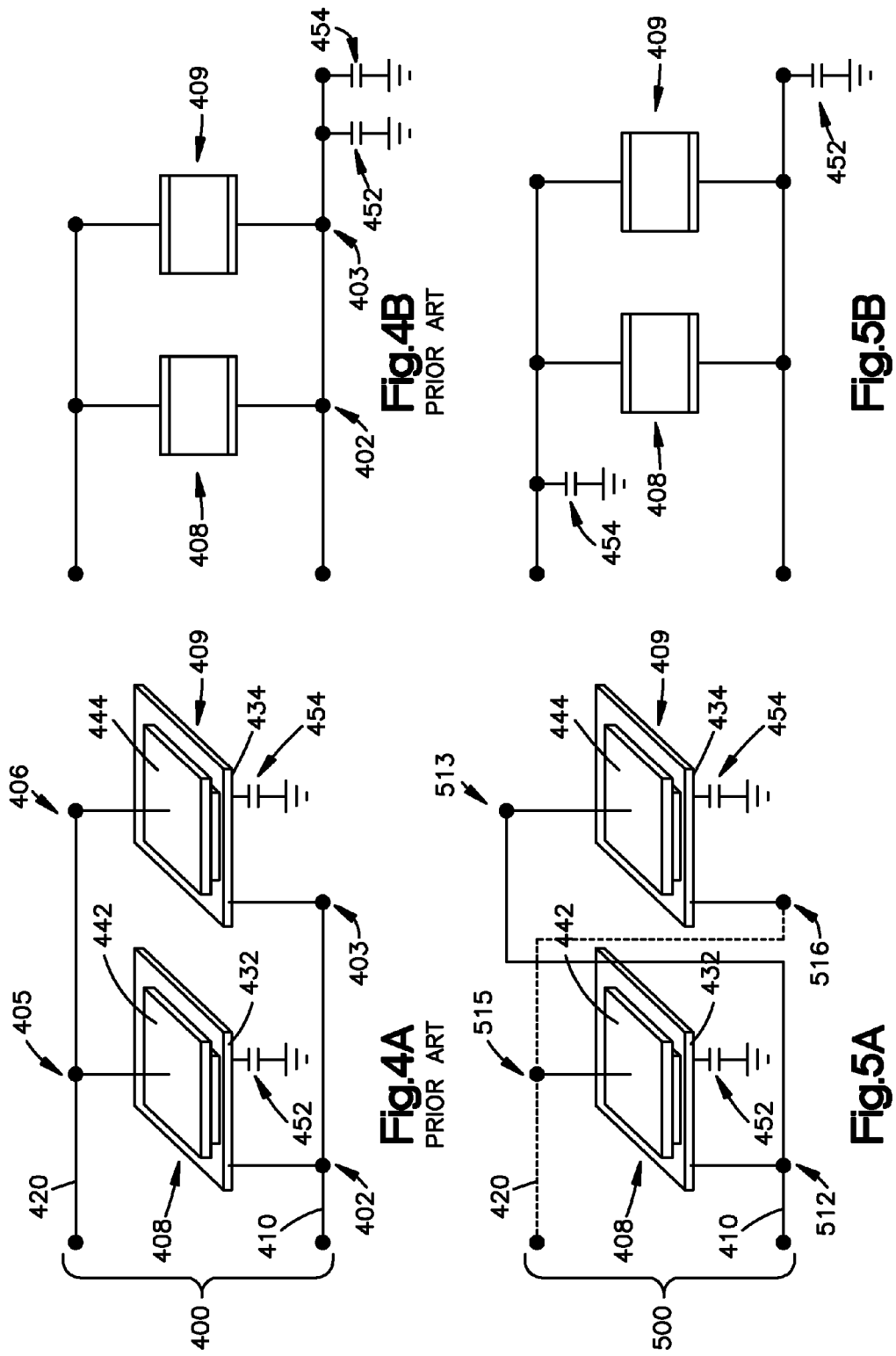

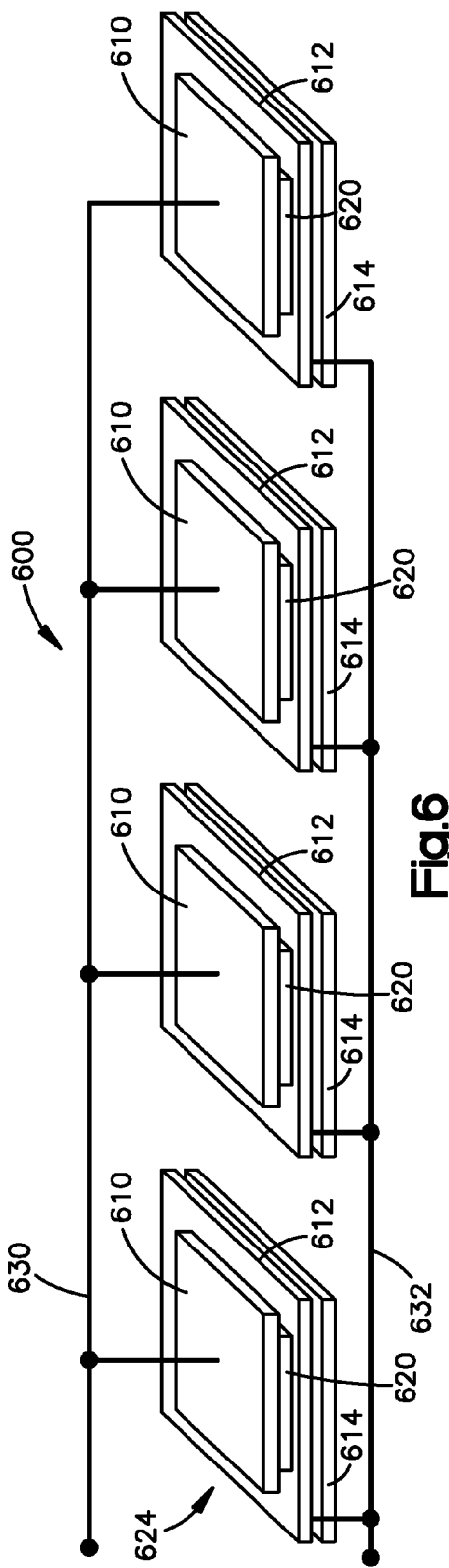
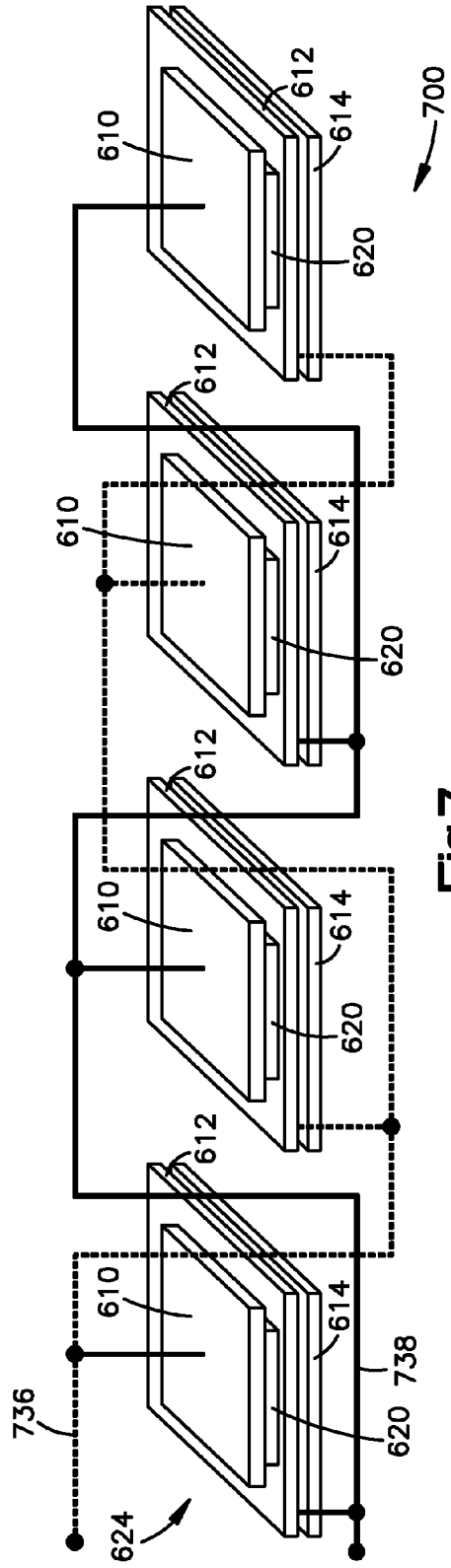

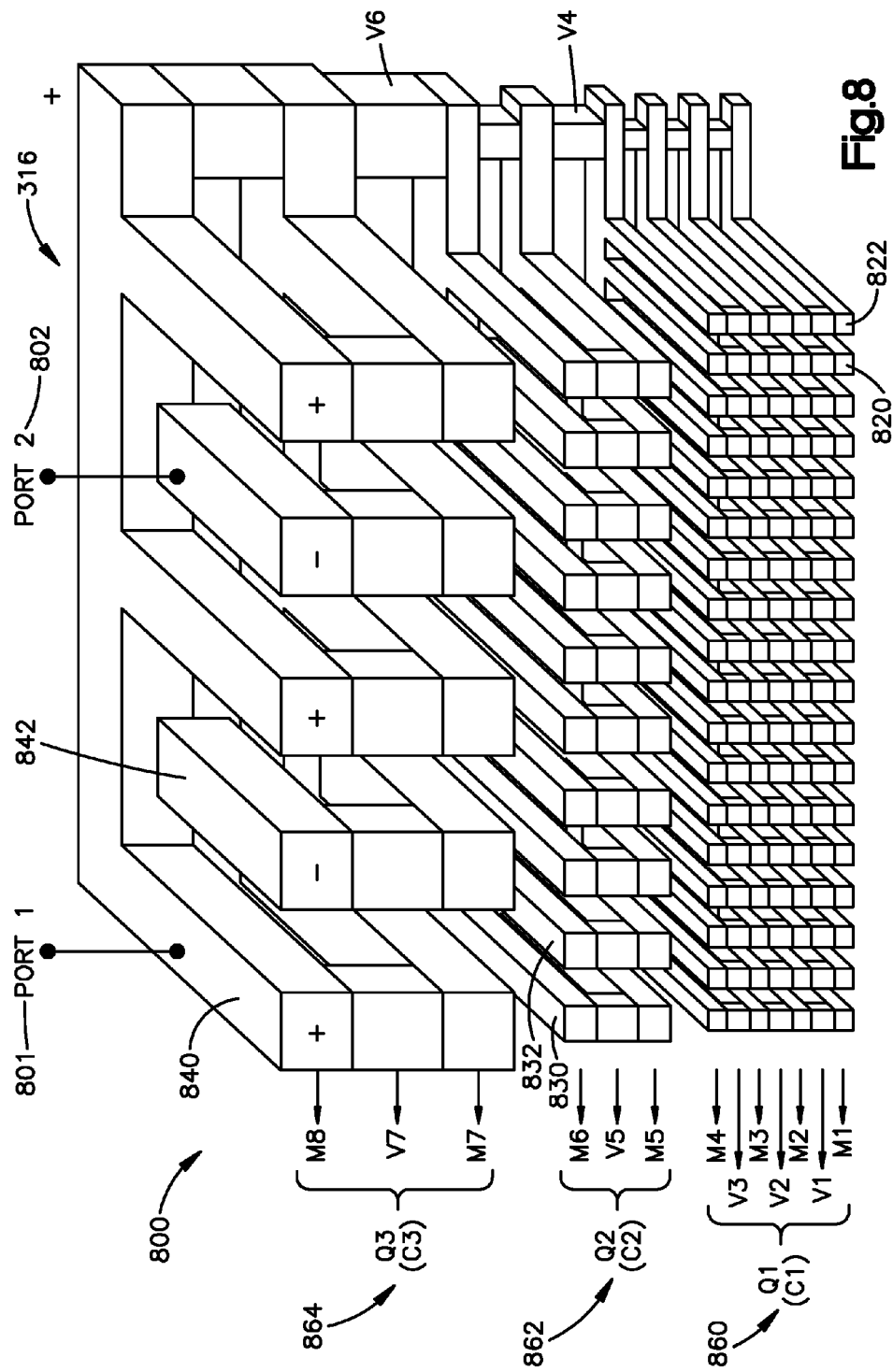

STRUCTURE FOR SYMMETRICAL CAPACITOR

CROSS REFERENCE TO RELATED APPLICATION

This application is a continuation-in-part of application Ser. No. 11/436,251, filed May 28, 2006.

TECHNICAL FIELD

This invention relates generally to methods, systems and design structures, and more specifically for capacitors and capacitor structures with symmetrical characteristics.

BACKROUND

On-chip capacitors are components of integrated circuits that are fabricated on silicon semiconductors. These capacitors are used for a variety of purposes: illustrative examples include bypass and capacitive matching as well as coupling and decoupling. The design and implementation of capacitor structures on silicon semiconductor chips may be dependent upon one or more symmetrical structural, target circuit quality and low parasitic resistance performance characteristics.

BRIEF SUMMARY

Methods, systems and design structures for a capacitance circuit assembly mounted on a semiconductor chip are provided comprising at least two capacitors mounted close to a substrate, wherein each capacitor has a lateral lower conductive plate mounted near enough to the substrate to have extrinsic capacitance greater than an upper plate extrinsic capacitance. One half of lower plates and one half of upper plates are connected to a first port, and a remaining one half of upper plates and lower plates are connected to a second port, the first and second port having about equal extrinsic capacitance from the lower plates. In another aspect, the at least two capacitors are Metal-Insulator-Metal Capacitors, and the capacitance circuit assembly is located in a back-end-of-line semiconductor capacitor circuit. In another aspect, the substrate further comprises a front-end-of-line capacitor defining a substrate footprint, and the at least two capacitors are electrically connected to the front-end-of-line capacitor and disposed above the substrate within the front-end-of-line capacitor footprint. In another aspect, the at least two capacitors are at least four capacitors. In a further aspect, the at least four capacitors are arrayed in a rectangular array generally parallel to the substrate. In another aspect, a Vertical Native Capacitor is electrically connected to at least two capacitors and disposed above the substrate within the front-end-of-line capacitor footprint. In another aspect, the first and second plates are formed of the same material. In a further aspect, the plates are a metal or polysilicon, and/or the dielectric material has a permeability value greater than about 4 (er>4).

In another aspect a method for forming a semiconductor chip capacitance circuit, comprises disposing a lower vertical-native capacitor metal layer above a planar front-end-of-line semiconductor base substrate; disposing planar first and second metal bottom plates parallel to and spaced a bottom plate distance from the semiconductor base substrate, the first bottom plate defining a first bottom plate footprint disposed above the semiconductor base substrate, the second bottom plate defining a second bottom plate footprint disposed above the semiconductor base substrate; forming a first insulator and a first planar metal top plate above the first bottom plate, the first top plate parallel to and spaced a top plate distance from the semiconductor base substrate, the first top plate and the first insulator and the first bottom plate defining a first metal-insulator-metal capacitor, the first top plate defining a footprint disposed above the semiconductor base substrate smaller than the first bottom plate footprint and exposing a first bottom plate remainder upper lateral connector surface, the top plate distance larger than the bottom plate distance; forming a second insulator and a second planar metal top plate above the second bottom plate, the second top plate parallel to and spaced the top plate distance from the semiconductor base substrate, the second top plate and the second insulator and the second bottom plate defining a second metal-insulator-metal capacitor, the second top plate defining a footprint disposed above the semiconductor base substrate smaller than the second bottom plate footprint and exposing a second bottom plate remainder upper lateral connector surface; disposing parallel positive port and negative port upper vertical-native capacitor metal layers over the first and second metal-insulator-metal capacitors, the positive port and the negative port upper vertical-native capacitor metal layers and the lower vertical-native capacitor metal layer defining a vertical-native capacitor structure; electrically connecting the first top plate and the second bottom plate upper remainder lateral connector surface to the positive port upper vertical-native capacitor metal layer; electrically connecting the second top plate and the first bottom plate upper remainder lateral connector surface to the negative port upper vertical-native capacitor metal layer; and electrically connecting the lower vertical-native capacitor metal layer to a one of the negative port upper vertical-native capacitor metal layer and the positive port upper vertical-native capacitor metal layer.

In one aspect a method comprises incorporating metal-insulator-metal capacitors plates between the upper and the lower vertical-native capacitor metal layers within a semiconductor chip capacitance circuit back-end-of-line region. In another aspect a method comprises the first top plate forming a first top plate extrinsic capacitance with the semiconductor base substrate as a function of the top plate distance; the second top plate forming a second top plate extrinsic capacitance with the semiconductor base substrate as a function of the top plate distance; the first bottom plate forming a first bottom plate extrinsic capacitance with the semiconductor base substrate as a function of the bottom plate distance and greater than the first top plate extrinsic capacitance; the second bottom plate forming a second bottom plate extrinsic capacitance with the semiconductor base substrate as a function of the bottom plate distance and greater than the second top plate extrinsic capacitance; the electrical connecting of the first top plate and the second bottom plate upper remainder lateral connector surface to the positive port upper vertical-native capacitor metal layer imparting a total metal-insulator-metal capacitor extrinsic capacitance to the positive port equal to a sum of the first top plate extrinsic capacitance and the second bottom plate extrinsic capacitance; and the electrical connecting of the second top plate and the first bottom plate upper remainder lateral connector surface to the negative port upper vertical-native capacitor metal layer imparting a total metal-insulator-metal capacitor extrinsic capacitance to the negative port equal to a sum of the second top plate extrinsic capacitance and the first bottom plate extrinsic capacitance and equal to the positive port total metal-insulator-metal capacitor extrinsic capacitance.

In one aspect a method comprises forming a semiconductor base substrate as a front-end-of-line metal-oxide-silicon capacitor base substrate. In another aspect upper and the lower vertical-native capacitor metal layers define a vertical-native capacitor footprint disposed above the base substrate and encompassing the first bottom plate and the second bottom plate footprints, disposing a first terminal on the positive port upper vertical-native capacitor metal layer within the vertical-native capacitor footprint and a second terminal on the negative port upper vertical-native capacitor metal layer within the vertical-native capacitor footprint. In one method pluralities of top plates and bottom plates are provided, and in one aspect disposed in a rectangular array generally parallel to the base substrate.

One method for forming a semiconductor chip capacitance circuit by incorporating a plurality of metal-insulator-metal capacitors between upper and lower vertical-native capacitor metal layers within a semiconductor chip capacitance circuit back-end-of-line region comprises: disposing the lower vertical-native capacitor metal layer above a planar front-end-of-line metal-oxide-silicon capacitor base substrate; forming a lower dielectric material layer over a first portion of the lower vertical-native capacitor metal layer; forming planar first and second metal-insulator-metal capacitor bottom plates on the lower dielectric material layer each parallel to and spaced a bottom plate distance from the semiconductor base substrate, each of the first and second bottom plates defining a bottom plate footprint disposed above the semiconductor base substrate, the lower dielectric material layer electrically insulating the first and the second bottom plates from the lower vertical-native capacitor metal layer; forming a first metal-insulator-metal capacitor insulator layer on the first bottom plate defining a first insulator footprint disposed above the semiconductor base substrate smaller than and above the first bottom plate footprint and exposing a first bottom plate lateral connector upper surface; forming a second metal-insulator-metal capacitor insulator layer on the second bottom plate defining a second insulator footprint disposed above the semiconductor base substrate smaller than and above the second bottom plate footprint and exposing a second bottom plate lateral connector upper surface; forming a first metal-insulator-metal capacitor top plate on the first insulator layer parallel to and spaced a top plate distance from the semiconductor base substrate defining a first top plate footprint disposed above the first insulator footprint and exposing the first bottom plate lateral connector upper surface; forming a second metal-insulator-metal capacitor top plate on the second insulator layer parallel to and spaced the top plate distance from the semiconductor base substrate defining a second top plate footprint disposed above the second insulator footprint and exposing the second bottom plate lateral connector upper surface; forming a comprehensive dielectric material layer defining vias over a remainder exposed portion of the lower vertical-native capacitor metal layer, the first and the second exposed bottom plate lateral connector upper surfaces and the first and the second top plates; and disposing parallel positive port and negative port upper vertical-native capacitor metal layers upon the comprehensive dielectric material layer, the first top plate and the second exposed bottom plate lateral connector upper surface each in a via circuit connection through the comprehensive dielectric material layer with the positive port upper vertical-native capacitor metal layer, the second top plate and the first exposed bottom plate lateral connector upper surface each in a via circuit connection through the comprehensive dielectric material layer with the negative port upper vertical-native capacitor metal layer, and the remainder exposed lower vertical-native capacitor metal layer portion in a via circuit connection through the comprehensive dielectric material layer with a one of the negative and the positive upper vertical-native capacitor metal layers.

A capacitance circuit assembly mounted on a semiconductor chip comprises a lower vertical-native capacitor metal layer disposed above a planar front-end-of-line semiconductor base substrate; planar first and second metal bottom plates disposed parallel to and spaced a bottom plate distance from the semiconductor base substrate, the first bottom plate defining a first bottom plate footprint disposed above the semiconductor base substrate, the second bottom plate defining a second bottom plate footprint disposed above the semiconductor base substrate; a first planar metal top plate and a first insulator formed above the first bottom plate, the first top plate parallel to and spaced a top plate distance from the semiconductor base substrate, the first top plate and the first insulator and the first bottom plate defining a first metal-insulator-metal capacitor, the first top plate defining a footprint disposed above the semiconductor base substrate smaller than the first bottom plate footprint and exposing a first bottom plate remainder upper lateral connector surface, the top plate distance larger than the bottom plate distance; a second planar metal top plate and a second insulator formed above the second bottom plate, the second top plate parallel to and spaced the top plate distance from the semiconductor base substrate, the second top plate and the second insulator and the second bottom plate defining a second metal-insulator-metal capacitor, the second top plate defining a footprint disposed above the semiconductor base substrate smaller than the second bottom plate footprint and exposing a second bottom plate remainder upper lateral connector surface; and parallel positive port and negative port upper vertical-native capacitor metal layers disposed over the first and second metal-insulator-metal capacitors, the positive port and the negative port upper vertical-native capacitor metal layers and the lower vertical-native capacitor metal layer defining a vertical-native capacitor; wherein the first top plate and the second bottom plate upper remainder lateral connector surface are electrically connected to the positive port upper vertical-native capacitor metal layer, the second top plate and the first bottom plate upper remainder lateral connector surface are electrically connected to the negative port upper vertical-native capacitor metal layer, and the lower vertical-native capacitor metal layer is electrically connected to a one of the negative port upper vertical-native capacitor metal layer and the positive port upper vertical-native capacitor metal layer.

In one semiconductor capacitance circuit assembly the metal-insulator-metal capacitors plates are incorporated between the upper and the lower vertical-native capacitor metal layers within a semiconductor chip capacitance circuit back-end-of-line region. In another semiconductor capacitance circuit assembly a first top plate forms a first top plate extrinsic capacitance with the semiconductor base substrate as a function of the top plate distance; a second top plate forms a second top plate extrinsic capacitance with the semiconductor base substrate as a function of the top plate distance; a first bottom plate forms a first bottom plate extrinsic capacitance with the semiconductor base substrate as a function of the bottom plate distance and greater than the first top plate extrinsic capacitance; a second bottom plate forms a second bottom plate extrinsic capacitance with the semiconductor base substrate as a function of the bottom plate distance and greater than the second top plate extrinsic capacitance; the electrical connecting of the first top plate and the second bottom plate upper remainder lateral connector surface to the positive port upper vertical-native capacitor metal layer imparting a total metal-insulator-metal capacitor extrinsic capacitance to the positive port equal to a sum of the first top plate extrinsic capacitance and the second bottom plate extrinsic capacitance; and the electrical connecting of the second top plate and the first bottom plate upper remainder lateral connector surface to the negative port upper vertical-native capacitor metal layer imparting a total metal-insulator-metal capacitor extrinsic capacitance to the negative port equal to a sum of the second top plate extrinsic capacitance and the first bottom plate extrinsic capacitance, and wherein the total negative port metal-insulator-metal capacitor extrinsic capacitance is equal to the total positive port metal-insulator-metal capacitor extrinsic capacitance.

In one semiconductor capacitance circuit assembly the semiconductor base substrate is a front-end-of-line metal-oxide-silicon capacitor base substrate. In another semiconductor capacitance circuit assembly upper and the lower vertical-native capacitor metal layers define a vertical-native capacitor footprint disposed above the base substrate and encompassing the first bottom plate and the second bottom plate footprints, further comprising a first terminal disposed on the positive port upper vertical-native capacitor metal layer within the vertical-native capacitor footprint and a second terminal disposed on the negative port upper vertical-native capacitor metal layer within the vertical-native capacitor footprint. In one semiconductor capacitance circuit assembly pluralities of first top plates, first bottom plates, second top plates and second bottom plates are provided, and in one capacitance circuit assembly the pluralities are disposed in a rectangular array generally parallel to the base substrate.

In one capacitance circuit assembly each of the top metal plates and the bottom metal plates comprise the same material. In another capacitance circuit assembly the plate's material is a metal material or a polysilicon material. And in another capacitance circuit assembly the first insulator and the second insulator comprise dielectric material having a permeability value greater than about 4 (er>4).

In another aspect a design structure is embodied in a machine readable medium, the design structure comprising disposing a lower vertical-native capacitor metal layer above a planar front-end-of-line semiconductor base substrate; disposing planar first and second metal bottom plates parallel to and spaced a bottom plate distance from the semiconductor base substrate, the first bottom plate defining a first bottom plate footprint disposed above the semiconductor base substrate, the second bottom plate defining a second bottom plate footprint disposed above the semiconductor base substrate; forming a first insulator and a first planar metal top plate above the first bottom plate, the first top plate parallel to and spaced a top plate distance from the semiconductor base substrate, the first top plate and the first insulator and the first bottom plate defining a first metal-insulator-metal capacitor, the first top plate defining a footprint disposed above the semiconductor base substrate smaller than the first bottom plate footprint and exposing a first bottom plate remainder upper lateral connector surface, the top plate distance larger than the bottom plate distance; forming a second insulator and a second planar metal top plate above the second bottom plate, the second top plate parallel to and spaced the top plate distance from the semiconductor base substrate, the second top plate and the second insulator and the second bottom plate defining a second metal-insulator-metal capacitor, the second top plate defining a footprint disposed above the semiconductor base substrate smaller than the second bottom plate footprint and exposing a second bottom plate remainder upper lateral connector surface; disposing parallel positive port and negative port upper vertical-native capacitor metal layers over the first and second metal-insulator-metal capacitors, the positive port and the negative port upper vertical-native capacitor metal layers and the lower vertical-native capacitor metal layer defining a vertical-native capacitor structure; electrically connecting the first top plate and the second bottom plate upper remainder lateral connector surface to the positive port upper vertical-native capacitor metal layer; electrically connecting the second top plate and the first bottom plate upper remainder lateral connector surface to the negative port upper vertical-native capacitor metal layer; and electrically connecting the lower vertical-native capacitor metal layer to a one of the negative port upper vertical-native capacitor metal layer and the positive port upper vertical-native capacitor metal layer. One design comprises a netlist. And another design structure resides on storage medium as a data format used for the exchange of layout data of integrated circuits.

BRIEF DESCRIPTION OF THE SEVERAL VIEWS OF THE DRAWINGS

FIGS. 4a and 4b depict a schematic perspective of a conventional prior art connection of two MIM capacitors relative to a substrate;

FIGS. 5a and 5b depict a schematic perspective of a connection of two MIM capacitors relative to a substrate according to this invention;

FIG. 6 depicts a schematic perspective of a conventional prior art connection of four MIM capacitors relative to a substrate;

FIG. 7 depicts a schematic perspective of a connection of four MIM capacitors relative to a substrate according to this invention.

FIG. 8 is perspective view of a VNCAP element according to the present invention;

DETAILED DESCRIPTION

Capacitor structures may be categorized as being formed in one of two regions: the Front End Of (production) Line (FEOL), or the Back End Of the Line (BEOL). In integrated-circuit fabrication lines, FEOL conventionally refers to earlier process stages that directly modify the semiconductor substrate or the immediate contacts to it; for example, dopant diffusion and implantation, sputtering of gate films, oxidations, and the patterning steps associated with these. In contradistinction, the BEOL is metallization (PVD) for interconnects and vias (vertical interconnects between planar interconnects) and associated non-conducting depositions and growths (for example, polymers, glasses, oxides, nitrides, and oxinitrides) for electrical isolation, dielectrics (for capacitance), diffusion barriers, and mechanical passivation (in particular, to prevent failure of interconnects by electromigration and stress migration). FEOL and BEOL are used in transferred sense to refer to the levels of an IC fabricated in the corresponding stages. BEOL is the metallization layers (say between four and ten) and associated insulating layers, and FEOL everything below that—mostly transistors.

It is known to use a metal oxide silicon (MOS) capacitor, or MOSCAP, for semiconductor chip capacitor elements formed on the chip substrate in the FEOL. However, MOSCAP capacitors generally require large chip area footprints in integrated circuits (IC). Accordingly, design requirements typically result in requiring large semiconductor chip footprint areas or real estate for MOSCAP capacitor structures relative to their circuit capacitance properties, resulting in high production costs and reduced semiconductor chip area availability for other circuit structures. Moreover, current leakage during a semiconductor circuit's idle mode is known to result in increased power consumption. Silicon semiconductor chip capacitor structures thus usually require large MOSCAP capacitor structures in order to avoid current leakage problems.

As the production cost of an IC is generally proportional to the real estate required, it is desired to reduce IC chip costs by reducing the footprint required for a MOSCAP structure. Accordingly, one possible technique for reducing FEOL MOSCAP footprints is to form additional capacitor structures in the BEOL in circuit communication with the FEOL MOSCAP, preferably increasing the capacitance of the total FEOL/BEOL capacitor structure while resulting in a relatively smaller FEOL MOSCAP footprint.

Figure 1:
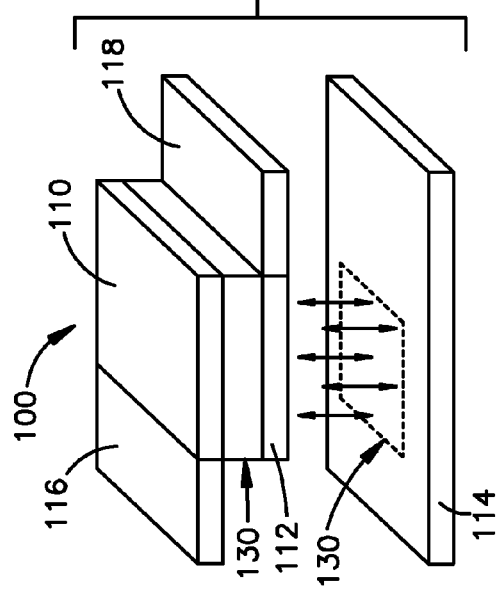
FIGS. 1 and 2 are schematic perspective depictions of two prior art techniques for mounting capacitors on a substrate.
Figure 2:
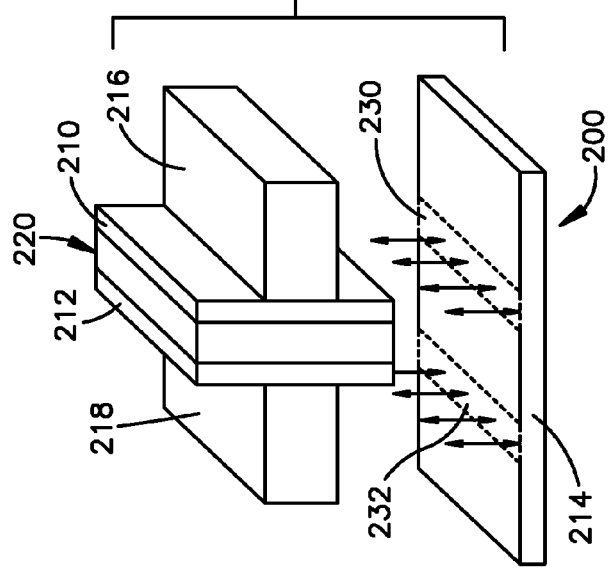

Two types of capacitors commonly utilized in the BEOL are a Metal-Insulator-Metal Capacitor (MIMCAP) 100 schematically illustrated in FIG. 1 with respect to a chip substrate 114, and a Vertical Native Capacitor (VNCAP) 200 schematically illustrated in FIG. 2. (FEOL structures are omitted for simplicity of illustration.) The MIMCAP 100 comprises a first plate 110 and a second plate 112, each having a connector or port 116, 118, respectively, with a dielectric material 120 placed between the plates 110, 112 to complete the capacitive structure. The VNCAP 200 also comprises a first plate 210 and a second plate 212, each having a connector or port 216, 218, respectively, with a dielectric material 220 placed between the plates 210, 212 to complete the capacitive structure. What is significant is that the lateral arrangement of the MIMCAP 100 plates 110, 112 above the substrate footprint 130 results in asymmetrical parasitic capacitances of the respective plates 110, 112, whereas the vertical arrangement of the generally parallel VNCAP 200 plates 210, 212, projecting parallel plate footprints 230, 232, respectively, results in symmetrical parasitic plate 210, 212 capacitance properties.

The MIMCAP 100 and VNCAP 200 each offer distinctive circuit behaviors and, in some BEOL applications, combinations of one or more MIMCAP's 100 with one or more VNCAP's 200 may be preferred. However, the asymmetrical parasitic capacitances of the MIMCAP 100 plates 110, 112 produce a polarity for the port terminals 116, 118. In one respect, a circuit using port 116 as an input port and port 118 as an output port results in different equivalent circuit behavior. In another respect, the polarity difference may render the MIMCAP 100 a unidirectional device. And incorrect polarity usage may cause circuit performance degradation. Accounting for such polarity issues results in circuit design inefficiencies as additional design time must be expended to distinguish between input and output polarities.

In many instances, multiple MIMCAP capacitors are required on a single chip substrate, with each having the same intrinsic capacitance value. In configurations wherein the capacitors are close to the substrate, the variable extrinsic capacitances between the bottom plates closest to the substrate cannot be adequately controlled for in circuit design, as the value of the extrinsic capacitances may not be precisely predicted. Therefore, in conventional prior art practices wherein all of the plates closest to the substrate are connected together, and all of the plates farthest from the substrate are connected together, divergent capacitance values are effectively created in the otherwise individually equivalent capacitors.

Additional problems arise for high-density on-chip BEOL capacitor structures incorporating both MIMCAP's 100 and VNCAP's 200, since parallel connections between the VNCAP 200 and MIMCAP 100 components must be provided to accommodate the divergent polarities of the ort terminals 116, 118, and forming such parallel connections presents structural limitations on the resultant composite MIMCAP 100/VNCAP 200 BEOL structure that diminishes possible chip real estate efficiencies. It also presents other difficulties in providing a symmetrical BEOL capacitor structure created from multiple VNCAP's and MIMCAP's.

Figure 3:
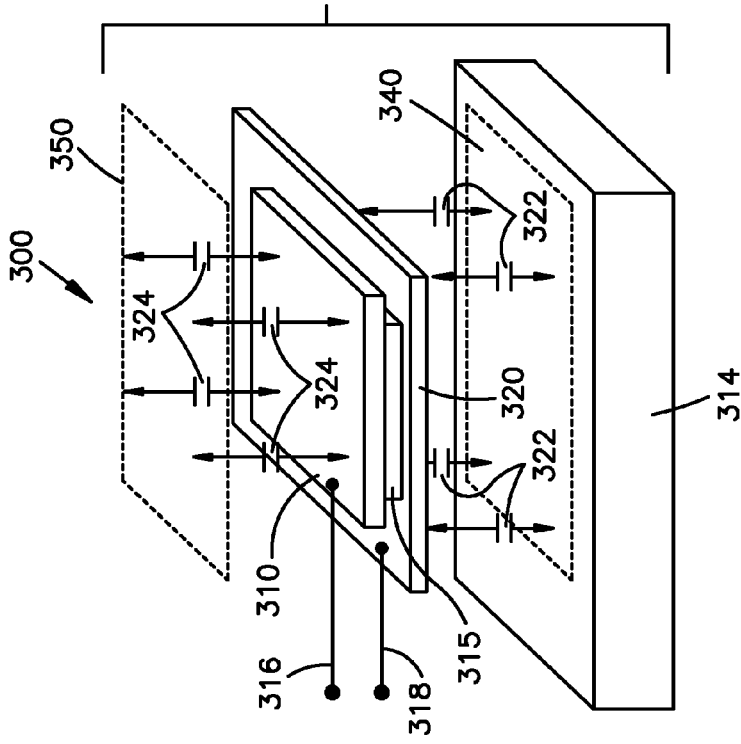
FIG. 3 depicts a schematic perspective of a MIM capacitor in relation to a substrate according to the present invention.

FIG. 3 illustrates an example of a single asymmetrical BEOL MIMCAP 300 appropriate for use with the present invention, having a top plate 310 and a bottom plate 320 arrayed laterally with respect to a substrate 314 and having connectors or ports 316, 318, respectively. A dielectric material 315 placed between the plates 310, 320 completes a capacitive structure in a lateral plate arrangement with respect to a FEOL substrate 314. (Other FEOL structures are omitted for simplicity of illustration).

The substrate 314 conventionally is formed of silicon which is dielectric. Preferably, the dielectric material 315 has a permeability value greater than about 4 (er>4). It is to be understood that the plates 310, 320 can be formed of the same material, e.g. polysilicon or copper or other conductive material, or different materials which can be used conventionally for capacitors, depending upon the need and processes.

The two conductive capacitive plates 310, 320 are mounted close enough to the substrate 314 to have an extrinsic or parasitic capacitance, represented diagrammatically by the extrinsic capacitance values 324, 322, respectively. The extrinsic capacitive values 322 between bottom plate 320 and substrate 314 defined within bottom plate footprint 340 are greater than the extrinsic capacitive values 324 between plate 310 and substrate 314 defined within top plate footprint 350, this difference resulting in differing port 316, 318 polarities as described above.

Referring now to FIG. 4, a pair of MIMCAP's 408, 409 are shown in a conventional parallel circuit structure 400 between two port terminals, wherein PORT 1 410 is connected to the bottom plates 432, 434 at connectors 402, 403, respectively; and PORT 2 420 is connected to the top plates 442, 444 at connectors 405, 406, respectively.

The bottom plates 432, 434 form parasitic extrinsic capacitors 452, 454, respectively, with a FEOL substrate disposed below (not shown for clarity of illustration, but as described above with respect to FIGS. 1 and 3). As the schematic representation of FIG. 4(b) illustrates, the parallel circuit structure 400 is asymmetrical as both of the parasitic extrinsic capacitors 452, 454 are accordingly connected to PORT 1 410, and no parasitic extrinsic capacitors are connected to PORT 2 420.

In one aspect, a symmetrical multi-MIMCAP capacitor design is provided that eliminates the extrinsic/parasitic capacitance differences of individual asymmetrical MIM-CAP's between their laterally-oriented top and bottom plates with respect to a FEOL chip substrate. For example, FIG. 5 illustrates the pair of MIMCAP's 408, 409 in a novel cross-coupled parallel circuit structure 500 between the two port terminals, wherein PORT 1 410 is connected to the MIMCAP 408 bottom plate 432 at connector 512 and to the MIMCAP 409 top plate 444 at connector 513; and PORT 2 420 is connected to the MIMCAP 408 top plate 442 at connector 515 and to the MIMCAP 409 bottom plate 434 at connector 516. Again, the bottom plates 432, 434 form equivalent parasitic extrinsic capacitors 452, 454, respectively, with a FEOL substrate disposed below (not shown for clarity of illustration, but as described above with respect to FIGS. 1, 3 and 4). As the schematic representation of FIG. 5(b) illustrates, the cross-coupled parallel circuit structure 500 is symmetrical as parasitic extrinsic capacitor 452 is accordingly connected to PORT 1 410, and parasitic extrinsic capacitor 454 is connected to PORT 2 620.

In another aspect, more than two MIMCAP's may be arranged in a cross-coupled parallel circuit structure to provide symmetrical BEOL MIM structures. Parasitic extrinsic capacitors created through substrate proximity are allocated evenly between the two circuit ports in order to prevent port polarity. For example, FIG. 6 illustrates another conventional multi-capacitor MIM structure 600, wherein four MIM-CAP's 624 are arranged in a parallel circuit structure between a first port 630 and a second port 632, wherein all of the upper plates 610 are connected together by connector 630, and all of the bottom plates 612 more proximate to a chip substrate 614 are connected together by connector 632. (It is to be understood that the substrate 614 may be one continuous substrate element, and that the substrate is shown in discrete rectangular sections 614 in order to simplify and clarify the illustration.) Thus, there is no provision made for variations in the extrinsic capacitances of each of the MIMCAP's 624, and polarity results between the terminals 630 and 632.

In another aspect, FIG. 7 depicts a schematic perspective of an alternative circuit structure with the four MIM capacitors 624 relative to the substrate 614 according to this invention. More particularly, half of the upper plates 610 are connected to half of the bottom plates 612 by first port connectors 736, and the other half of the top plates 610 are connected by second port connectors 738 to the other half of the bottom plates 612. This results in a symmetrical capacitor circuit 700 design with respect to the substrate 614, whereby parasitic capacitance is allocated evenly to each of the first port 736 and second port 738, as also discussed with respect to FIG. 5 above. Thus, the present invention enables a composite symmetrical BEOL circuit 700 with multiple MIMCAP 624's, which offers improved Q-factor performance over a single asymmetrical MIMCAP BEOL circuit (such as MIMCAP 300 of FIG. 3) with a similar overall footprint.

In another aspect, the present invention also has application to multiple MIMCAP structures incorporating other types of capacitors. For example, it is desirable to incorporate VNCAP's in BEOL chip applications. FIG. 8 provides a perspective view of a VNCAP 800 illustrating a parallel metal plate and composite capacitance structure that is desirable in some BEOL capacitor applications. The VNCAP 800 is defined by three groups of progressively larger metal layers. A first bottom group 860 of four metal layers (M1 through M4) are each separated by an insulator (or dielectric) material layers having connective vias distributed there though (V1 through V3), generally the first metal layer M1 in circuit connection with FEOL circuit structures, illustratively including MOSCAP structures (not shown). A second middle group of larger metal layers 862 (M5 and M6, respectively, the fifth and sixth metal layers) are mounted on the first group of layers 860 and separated by a dielectric material/Via layer V4, with metal layers M5 and M6 separated from each other by dielectric/Via layer V5. Lastly, a third largest top group 864 of metal layers (M7 and M8, respectively, the seventh and eighth metal layers) are mounted atop the second metal layer group 862 and separated there from by a dielectric material/Via layer V6, from each other and a dielectric/Via layer V7.

In another aspect, each of the three VNCAP metal levels 860, 862 and 864 further comprise parallel "−" signed and "+" signed metal plates. More particularly, the VNCAP first level 860 metal layers M1 through M4 further each comprise a plurality of "+" signed metal plates 820 in an alternative horizontal parallel relationship with a plurality of "−" signed metal plates 822. The VNCAP second middle level 862 metal layers M5 and M6 further each comprise a plurality of "+" signed metal plates 830 in an alternative horizontal parallel relationship with a plurality of "−" signed metal plates 832. And the VNCAP third top level 864 metal layers M7 and M8 further each comprise a plurality of "+" signed metal plates 840 in an alternative horizontal parallel relationship with a plurality of "−" signed metal plates 842.

VNCAP's may offer superior capacitance capabilities in BEOL applications over smaller footprints than may be practiced with other capacitor structures. In another aspect, the three divergently sized VNCAP 800 bottom 860, middle 862 and top 864 metal layers each define a capacitor region having discrete capacitance values Q1(C1), Q2(C2) and Q3(C3), respectively. Thus, the VNCAP 800 may improve Q-factor performance in the overall FEOL/BEOL circuit structure by enabling multiple discrete Q elements within a small footprint, as is apparent to one skilled in the art.

Figure 9:
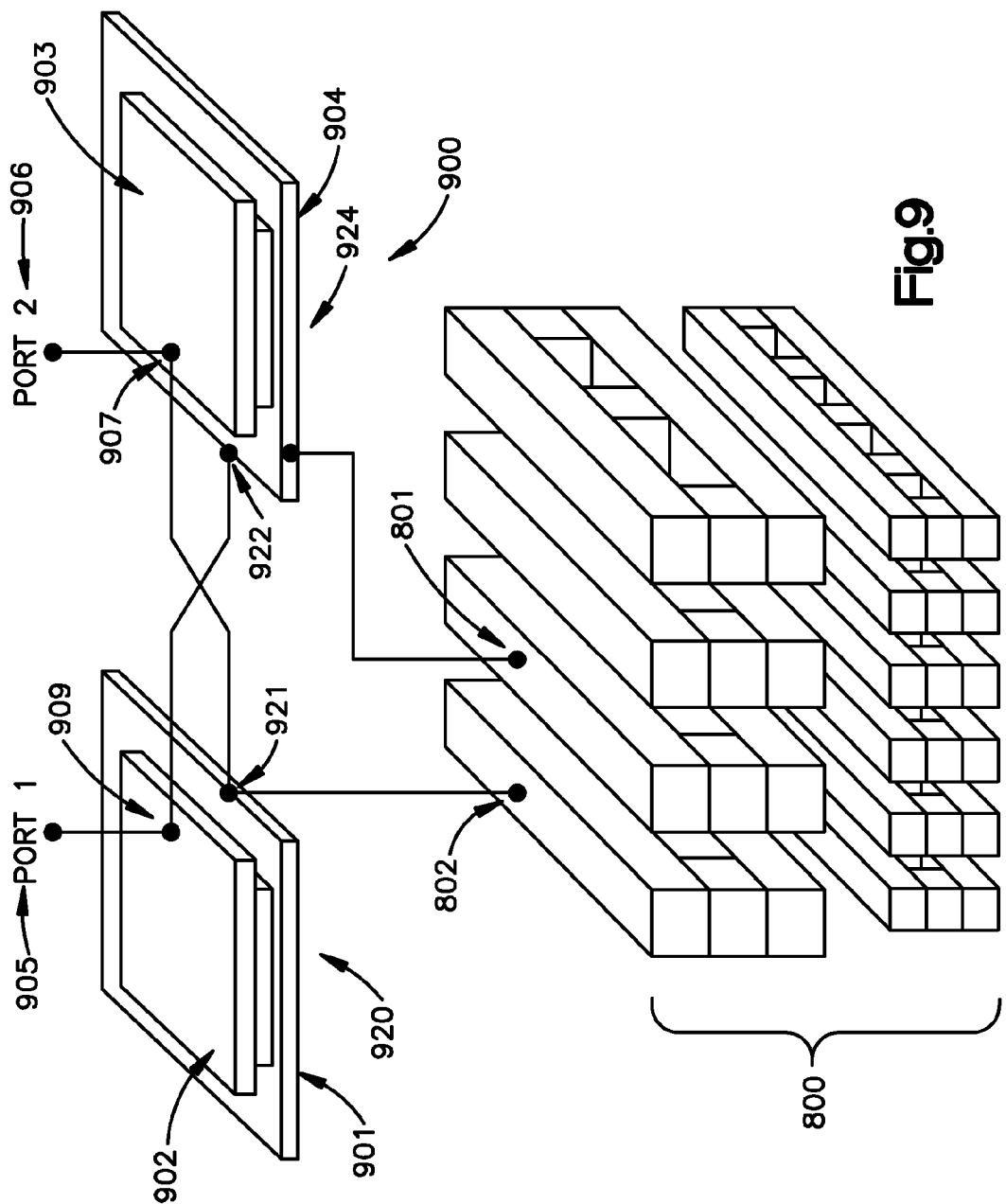
FIG. 9 depicts a schematic perspective of a connection of two MIM capacitors to a VNCAP according to this invention.

Accordingly, in another aspect of the present invention, FIG. 9 depicts a schematic perspective of a symmetrical multi-capacitor BEOL circuit structure 900 according to this invention. More particularly, first and second MIM capacitors 920, 924 are in a cross-coupled parallel circuit connection with the VNCAP 800 of FIG. 8. (For clarity, the VNCAP 800 middle metal layers 862 are omitted from the view shown in FIG. 9). A PORT 1 terminal 905 is thus in circuit connection 909 with the first MIMCAP 920 upper plate 902, in circuit connection 922 with the second MIMCAP 924 bottom plate 904 and with the positive "+" VNCAP 800 capacitor plates through terminal 802 (as described above with respect to FIG. 8). PORT 2 terminal 906 is in circuit connection 907 with the second MIMCAP 924 upper plate 903, in circuit connection 921 with the first MIMCAP 920 bottom plate 901 and with the negative "−" VNCAP 800 capacitor plates through terminal 801.

Although the present VNCAP example is described with respect to specified numbers of metal layers within designated capacitor groupings, as well as overall metal layer totals, it is to be understood that the inventions described herein are not restricted to the specific exemplary embodiments. It will be readily apparent that more or less metal layers may be practiced within VNCAP's within the teachings herein, and one skilled in the art may readily form alternative embodiments with different metal layer numbers and combinations.

Figure 10:
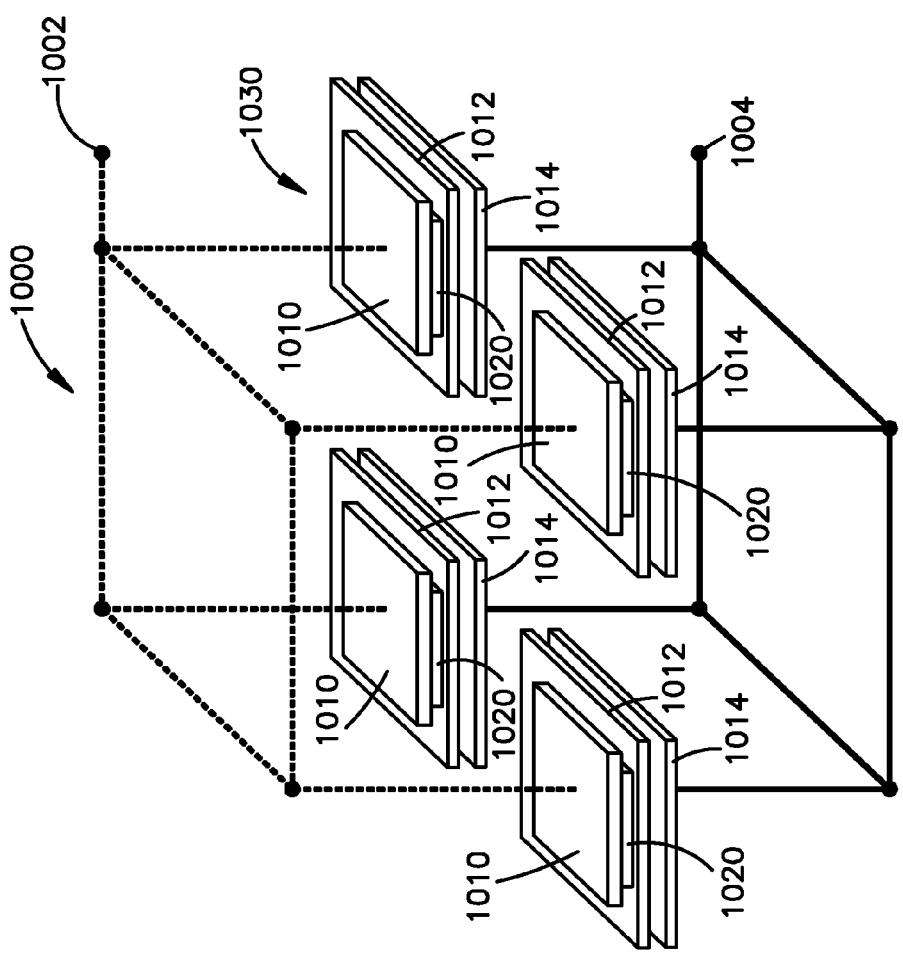
FIG. 10 depicts a schematic perspective of a conventional prior art connection of four MIM capacitors relative to a substrate.

In another aspect, the present invention may also be practiced with other multi-MIMCAP structures. FIG. 10 depicts a schematic perspective of a conventional rectangular array multi-capacitor MIM structure 1000, wherein four MIM-CAP's 1030 having upper plates 1010, lower plates 1012 and dielectric layer 1020 therebetween are arranged in a parallel circuit structure between a first port 1002 and a second port

1004. This type of array may provide improved Q-factor values relative to other single MIMCAP or multi-MIMCAP arrays in BEOL applications. However, as discussed above, the four MIMCAP's 1030 each have greater parasitic capacitance values relative to the substrate 1014 at their bottom plates 1012 than at their upper plates 1010. In this conventional circuit structure, all of the upper plates 1010 are connected to the first port 1002, and all of the bottom plates 1012 more proximate to the chip substrate 1014 are connected to the second port 1004. (Again, it is to be understood that the substrate 1014 may be one continuous substrate element, and that the substrate is shown in discrete rectangular sections 1014 in order to simplify and clarify the illustration.) Thus, there is no provision made for variations in the extrinsic capacitances of each of the MIMCAP's 1030, and polarity results between the terminals 1002 and 1004 as discussed above.

Figure 11:
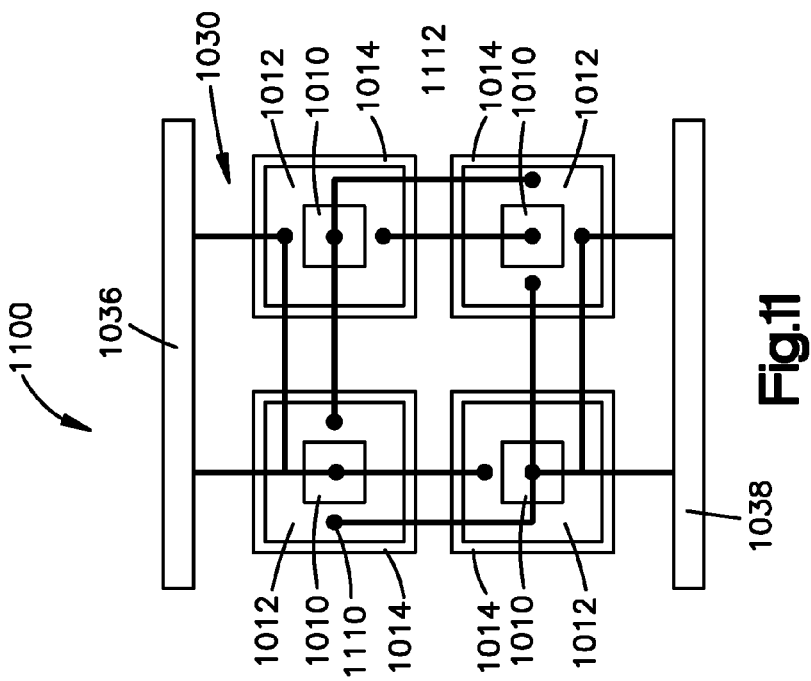
FIG. 11 depicts a top plan view of a symmetrical capacitor structure relative to a substrate according to this invention.

Accordingly, in another aspect, FIG. 11 provides a top plan view of symmetrical rectangular array multi-capacitor MIM structure 1100 according to the present invention. The four MIMCAP's 1030 arranged in a parallel circuit structure between a first port 1132 and a second port 1138, wherein half of the upper plates 1010 are connected to half of the bottom plates 1012 in adjacent MIMCAP's 1030 by port connectors 110 and port circuit wiring 1112, and the other half of the top plates 1010 are connected to the other half of the bottom plates 1012 in adjacent MIMCAP's 1030 by port connectors 110 and port circuit wiring 1112. This results in a symmetrical capacitor circuit 1100 design with respect to the substrate 1014, whereby parasitic capacitance is allocated evenly to each of the first port 1136 and second port 1138, as discussed above.

Figure 12:
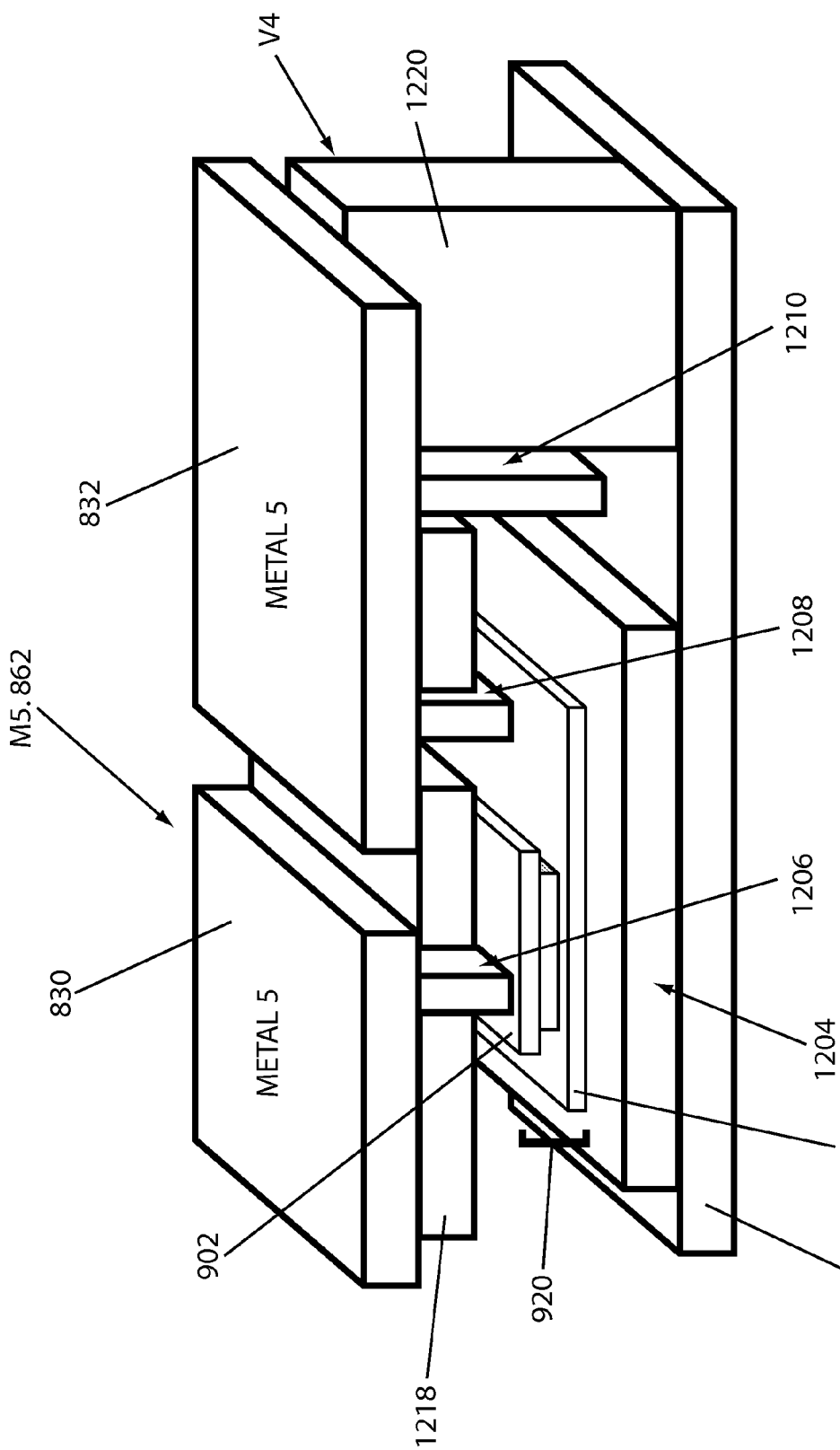
FIG. 12 is a side perspective illustration a composite VNCAP/MIMCAP structure according to the present invention.

FIG. 12 is a side perspective illustration of a portion of a composite VNCAP/MIMCAP structure according to the present invention. More particularly the MIMCAP 920 of FIG. 9 is incorporated between the VNCAP 800 metal layers within the dielectric/Via layer V4 between the bottommost Metal 5 layer of the middle VNCAP layers 862 and the uppermost Metal 4 layer of the smaller bottom VNCAP metal layers 860. A top node contact 1206 electrically connects the MIMCAP upper plate 902 to the upper Metal 5 layer 862"+" signed metal plates 830, and a bottom node contact 1208 disposed laterally to the top node contact 1206 electrically connects the MIMCAP bottom plate 904 to the upper Metal 5 layer 862 "−" signed metal plates 832. More particularly the MIMCAP 920 top node contact 1206 provides circuit connection to a "+" signed first port (not shown) and the MIMCAP 920 bottom node contact 1208 provides circuit connection to a "−" signed second port (not shown), wherein the second MIMCAP 924 (hot shown in FIG. 12) is cross-coupled to said first and second ports to provide extrinsic capacitance symmetry, with a top node contact electrically connecting its upper plate to the 862 "−" signed metal plates 832 and a bottom node contact electrically connecting its bottom plate to the "+" signed metal plates 830, as will be understood by reference to the MIMCAP 920,924 circuit connections illustrated by FIGS. 8 and 9 and described above.

The dielectric/Via layer V4 comprises a dielectric electrically-insulating material 1220 disposed between the upper Metal 5 layer 862 and the lower Metal 4 860 layer, structurally supporting the Metal 5 layers above the Metal 4 layers as well as electrically separating them. In some embodiments the electrically-insulating material 1220 is a silicon dioxide compound, though other electrically-insulating materials may be practiced. Vias 1210 are formed through the dielectric 1220 to form electrical connections, for example between the upper Metal 5 layer 862 "−" signed metal plate 832 and the lower Metal 4 860 layer as shown.

In the present invention special MIMCAP port contacts 1206 and 1208 are also formed with the V4 electrically-insulating material 1220. And the MIMCAP bottom plate 904 is electrically-insulated from the lower Metal 4 860 layer from a layer 1204 of the electrically-insulating material 1220. In one aspect the top node contact 1206 is shorter than the bottom node contact 1208, since the upper plate 902 is closer to the "+" signed metal plate 830 relative to the bottom plate 904/"−" signed metal plate 832 distance.

In the structure of FIG. 12, incorporation of the MIMCAP's 920,924 efficiently increases the capacitance density of the VNCAP 800 without requiring additional chip structure real estate or increasing the size of the resultant structure through use of the already-existing dielectric/Via layer V4. This is accomplished by taking advantage of the naturally asymmetrical structures of the MIMCAP 920,924, which provides for lateral MIMCAP 920,924 port connections to the upper Metal 5 layer 862 while maintaining electrical separation from the lower Metal 4 860 layer through incorporation into the freely-available existing dielectric/Via layer V4 dielectric material. Chip area encompassed by the dielectric layer 1204 and the top surfaces of the Metal 4 860 layer below the MIMCAP's 920,924 are also free for use in chip design, due to the top node contact 1206 and bottom node contact 1208 lateral-connection arrangement, in this aspect further providing chip efficiencies while still increasing BEOL capacitance density.

Thus the present invention enables the use of asymmetrical capacitor components in vertical BEOL capacitor structures. More particularly, VNCAP's generally have a natural symmetry with the extrinsic capacitance of their two nodes equivalent, enabling incident substrate noise from the two nodes to cancel and the VNCAP extrinsic capacitance to be added positively into capacitance density for the parallel plate capacitor geometry. Thus multiple VNCAP layers may be easily incorporated into vertical BEOL capacitor structures without impact on the symmetry of the resultant BEOL capacitor structure. However, coupling leakage for high frequency signals may occur between the VNCAP nodes between capacitor plates, and parallel plate VNCAP BEOL capacitor structure applications are accordingly generally limited to by-pass capacitor or AC-decoupling capacitor structures.

MIMCAP's do not suffer the same coupling leakage problems. And including MIMCAP's in BEOL capacitor structures can also offer higher capacitance density relative to VNCAP, MOSCAP and other capacitor structures. For example, capacitors may be compared with respect to relative capacitance density, which may be defined as capacitance per 1 $\mu m^2$. In silicon technology application examples MIMCAP's have generally smaller dimensions than MOSCAP's then may be generally practiced, in part due to higher MIMCAP permeability values which increase capacitance density. Thus MIMCAP capacitance density generally approaches about 20 fF/$\mu m^2$, compared to MOS capacitance densities approaching about 5 fF/ $\mu m^2$. Thus MOSCAP's generally require larger chip real estate in order to achieve corresponding MIMCAP capacitance, which teaches away from use of MOSCAP's in efficient inter-metal layer incorporation in BEOL structures according to the present invention. The present invention provides efficiency in using naturally asymmetrical MIMCAP' s to form symmetrical BEOL MIMCAP/ VNCAP structures through novel smart connection layouts and structures according to the present invention, in some examples in combination with FEOL MOSCAP's.

Figure 13:
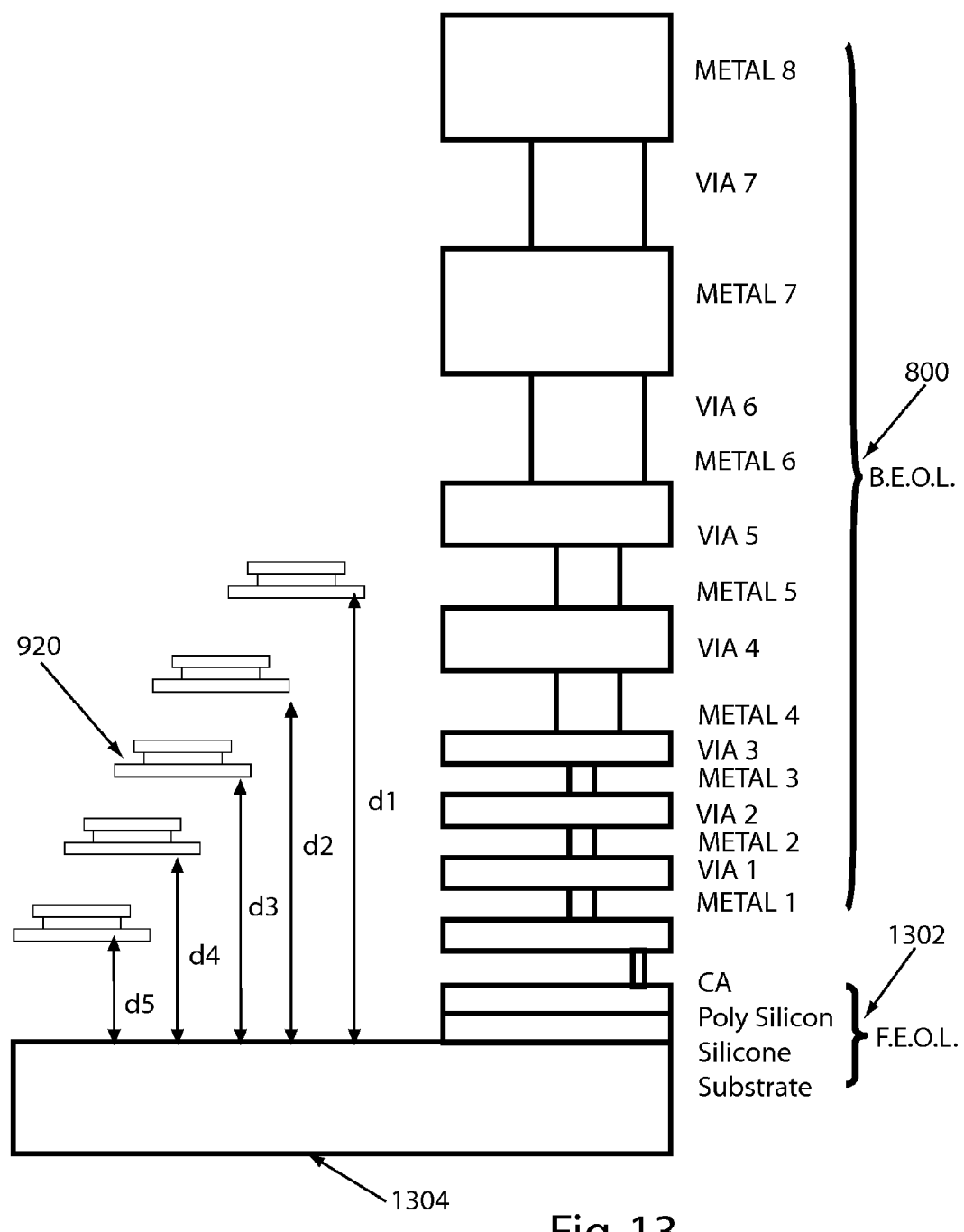
FIG. 13 illustrates a MIMCAP/VNCAP/MOSCAP structure according to the present invention.

The amount of extrinsic capacitance of a MIMCAP relative to a base substrate layer is inversely proportional to the distance of the MIMCAP from said base substrate layer. More particularly FIG. 13 illustrates the distance $d_n$ for the MIMCAP 920 from said base substrate layer 1304 for an exemplary but not exhaustive plurality of possible MIMCAP 920 locations within the VNCAP 800, and more particularly within a MIMCAP/VNCAP BEOL structure disposed above a FEOL MOSCAP 1302 comprising the base substrate layer 1304 according to the present invention. Thus locating the MIMCAP 920 between Metal layers 1 and 2 a distance $d_5$ from the base substrate 1304 results in a higher potential extrinsic capacitance relative to any other of the possible metal layer locations (distance $d_4$ for incorporation between Metal layers 2 and 3, etc.). Accordingly, locations of multiple MIMCAP's 920,924 with divergent distance $d_n$ values causes problems in balancing their respective extrinsic capacitances, and for this additional reason prior art teaching generally teaches away from incorporation of MIMCAP's in BEOL structures.

Figure 14:
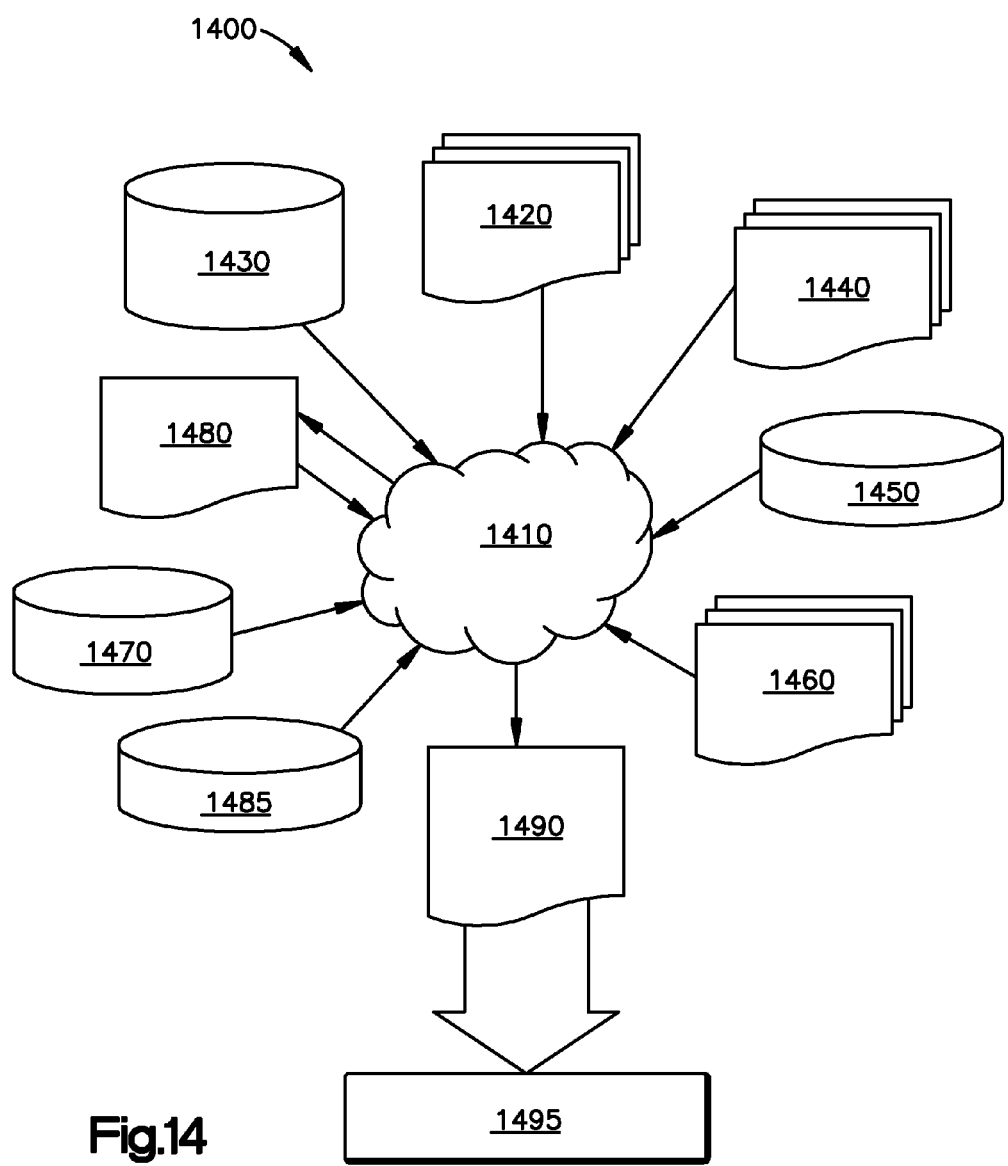
FIG. 14 is a flow diagram of a design process used in semiconductor design, manufacture, and/or test according to the present invention.

The structures of the present invention overcome these problems. Pluralities of MIMCAP's (for example the plurality circuits illustrated in FIGS. 9 and 11) are incorporated between any of the metal layers M1 through M8 as illustrated in FIG. 12 and discussed above. However, it is preferred that only one inter-layer incorporation of MIMCAP's be practiced, independent of the number of MIMCAP's incorporated: for example, only between M4 and M5, or only between M2 and M3, etc. This provides for assuring symmetrical parasitic capacitance characteristics by avoiding divergent base substrate layer distance $d_n$ values between pluralities of different MIMCAP top plates 902,903 and between pluralities of different MIMCAP bottom plates 901, 904 and is also generally more efficient in existing silicon chip technology processes, wherein locating MIMCAP's in more than one dielectric/Via level Via1 through Via7 may cause manufacturing difficulties or inefficiencies. More particularly, only one MIMCAP may generally be fabricated between any of the M1 through M8 metal layers FIG. 14 shows a block diagram of an exemplary design flow 1400 used for example, in semiconductor design, manufacturing, and/or test. Design flow 1400 may vary depending on the type of IC being designed. For example, a design flow 1400 for building an application specific IC (ASIC) may differ from a design flow 1400 for designing a standard component. Design structure 1420 is preferably an input to a design process 1410 and may come from an IP provider, a core developer, or other design company or may be generated by the operator of the design flow, or from other sources. Design structure 1420 comprises an embodiment of the invention as shown in one or more of FIGS. 3, 5A, 5B, 7, 8, 9, 11, 12 and 13 in the form of schematics or HDL, a hardware-description language (e.g., Verilog, VHDL, C, etc.). Design structure 1420 may be contained on one or more machine readable medium. For example, design structure 1420 may be a text file or a graphical representation of an embodiment of the invention as shown in one or more of FIGS. 3, 5A, 5B, 7, 8, 9, 11, 12 and 13. Design process 1410 preferably synthesizes (or translates) an embodiment of the invention as shown in one or more of FIGS. 3, 5A, 5B, 7, 8, 9, 11, 12 and 13 into a netlist 1480, where netlist 1480 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 1480 is resynthesized one or more times depending on design specifications and parameters for the circuit.

Design process 1410 may include using a variety of inputs; for example, inputs from library elements 1430 which may house a set of commonly used elements, circuits, and devices, including models, layouts, and symbolic representations, for a given manufacturing technology (e.g., different technology nodes, 32 nm, 45 nm, 90 nm, etc.), design specifications 1440, characterization data 1450, verification data 1460, design rules 1470, and test data files 1485 (which may include test patterns and other testing information). Design process 1410 may further include, for example, standard circuit design processes such as timing analysis, verification, design rule checking, place and route operations, etc. One of ordinary skill in the art of integrated circuit design can appreciate the extent of possible electronic design automation tools and applications used in design process 1410 without deviating from the scope and spirit of the invention. The design structure of the invention is not limited to any specific design flow.

Design process 1410 preferably translates an embodiment of the invention as shown in one or more of FIGS. 3, 5A, 5B, 7, 8, 9, 11, 12 and 13, along with any additional integrated circuit design or data (if applicable), into a second design structure 1490. Design structure 1490 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in one or more of FIGS. 3, 5A, 5B, 7, 8, 9, 11, 12 and 13. Design structure 1490 may then proceed to a stage 1495 where, for example, design structure 1490: proceeds to tape-out, is released to manufacturing, is released to a mask house, is sent to another design house, is sent back to the customer, etc.

While preferred embodiments of the invention have been described herein, variations in the design may be made, and such variations will be apparent to those skilled in the art of capacitors, as well as to those skilled in other arts. For example, it will be understood that the present invention is not limited to the specific numbers and arrangements of MIMCAP's and VNCAP's described thus far, and the invention can work with circuit structures comprising more that four MIM capacitors.

What is claimed is:

1. A method for forming a semiconductor chip capacitance circuit, comprising:

forming a vertical-native capacitor comprising a plurality of vertical-native capacitor metal layers parallel to each other and vertically aligned above and parallel to a planar front-end-of-line semiconductor base substrate, adjacent layers of the vertical-native capacitor metal layers structurally and electrically separated by electrically-insulating dielectric material layers, each of the vertical-native capacitor metal layers comprising a plurality of positive port metal plates in an alternating horizontal parallel relationship with a plurality of negative port metal plates and in an alternating vertical parallel relationship to a plurality of negative port metal plates of an adjacent vertical-native capacitor metal layer;

forming first and second asymmetrical rectangular metal-insulator-metal capacitors within at least one of the dielectric material layers in a lateral rectangular array parallel to and spaced from the semiconductor base substrate;

the first asymmetrical metal-insulator-metal capacitor having a first planar rectangular metal bottom plate parallel to and spaced a bottom plate distance from the semiconductor base substrate and projecting a first bottom plate footprint vertically relative to the semiconductor base substrate, and a first planar rectangular metal top plate above and parallel to the first metal bottom plate and separated from the first bottom plate by the dielectric material, the first planar rectangular metal top plate parallel to and spaced a top plate distance from the semiconductor base substrate that is greater than the bottom plate distance, the first rectangular top plate smaller than the first rectangular bottom top plate and aligned to fit entirely within the first bottom plate footprint relative to the semiconductor base substrate and to expose a first bottom plate remainder upper lateral connector surface vertically within the first bottom plate footprint to a one of a vertical-native capacitor positive port metal plate horizontally alternating with a negative port metal plate located above the first bottom plate and above the at least one dielectric material layer;

the second asymmetrical metal-insulator-metal capacitor having a second planar rectangular metal bottom plate parallel to and spaced the bottom plate distance from the semiconductor base substrate and projecting a second bottom plate footprint vertically relative to the semiconductor base substrate, and a second planar rectangular metal top plate above and parallel to the second metal bottom plate and separated from the second bottom plate by the dielectric material, the second planar rectangular metal top plate parallel to and spaced the top plate distance from the semiconductor base substrate, the second rectangular top plate smaller than the second rectangular bottom top plate and aligned to fit entirely within the second bottom plate footprint relative to the semiconductor base substrate;

forming a first bottom plate port contact vertically within the dielectric material layer and within the first bottom plate footprint that electrically connects the exposed first bottom plate remainder upper lateral connector surface to the one vertical-native capacitor metal plate located vertically above the first bottom plate;

forming a first top plate port contact vertically within the at least one dielectric material layer and within the first bottom plate footprint that electrically connects the first top plate to an other of the of horizontally alternating vertical-native capacitor positive port metal plate and negative port metal plate located vertically above the first top plate and the at least one dielectric material layer;

electrically connecting the first top plate to the second bottom plate; and electrically connecting the second top plate to the first bottom plate.

2. The method of claim 1 comprising incorporating the first and second asymmetrical metal-insulator-metal capacitors within the at least one dielectric material layer within a semiconductor chip capacitance circuit back-end-of-line region.

3. The method of claim 2, further comprising:
the first top plate forming a first top plate extrinsic capacitance with the semiconductor base substrate as a function of the top plate distance;
the second top plate forming a second top plate extrinsic capacitance with the semiconductor base substrate as a function of the top plate distance;
the first bottom plate forming a first bottom plate extrinsic capacitance with the semiconductor base substrate as a function of the bottom plate distance, the first bottom plate extrinsic capacitance greater than the first top plate extrinsic capacitance;
the second bottom plate forming a second bottom plate extrinsic capacitance with the semiconductor base substrate as a function of the bottom plate distance, the second bottom plate extrinsic capacitance greater than the second top plate extrinsic capacitance;
the electrically connecting the exposed first bottom plate remainder upper lateral connector surface to the one vertical-native capacitor metal plate imparting a total metal-insulator-metal capacitor extrinsic capacitance to a first port in circuit communication with the vertical-native capacitor metal plate equal to a sum of the second top plate extrinsic capacitance and the first bottom plate extrinsic capacitance; and
the electrical connecting the first top plate to the other vertical-native capacitor metal plate imparting a total metal-insulator-metal capacitor extrinsic capacitance to a second port in circuit communication with the other vertical-native capacitor metal plate equal to a sum of the second bottom plate extrinsic capacitance and the first top plate extrinsic capacitance and equal to the first port total metal-insulator-metal capacitor extrinsic capacitance.

4. The method of claim 3, further comprising forming the planar front-end- of-line semiconductor base substrate as a metal-oxide-silicon capacitor base substrate.

5. The method of claim 4, further comprising:
the vertical-native capacitor metal layers defining a vertical-native capacitor footprint disposed vertically above the metal-oxide-silicon capacitor base substrate and encompassing the first and the second bottom plate footprints;
disposing a first port terminal within the vertical-native capacitor footprint on an upper layer port metal plate in circuit communication with the one of the vertical-native capacitor metal layer plates; and
disposing a second port terminal within the vertical-native capacitor footprint on an upper layer port metal plate in circuit communication with the other of the vertical-native capacitor metal layer plates.

6. A design structure embodied in a machine readable medium, the design structure comprising:
forming a vertical-native capacitor comprising a plurality of vertical-native capacitor metal layers parallel to each other and vertically aligned above and parallel to a planar front-end-of-line semiconductor base substrate, adjacent layers of the vertical-native capacitor metal layers structurally and electrically separated by electrically-insulating dielectric material layers, each of the vertical-native capacitor metal layers comprising a plurality of positive port metal plates in an alternating horizontal parallel relationship with a plurality of negative port metal plates and in an alternating vertical parallel relationship to a plurality of negative port metal plates of an adjacent vertical-native capacitor metal layer;

forming first and second asymmetrical metal-insulator-metal capacitors within at least one of the dielectric material layers in a lateral rectangular array parallel to and spaced from the semiconductor base substrate;

the first asymmetrical metal-insulator-metal capacitor having a first planar rectangular metal bottom plate parallel to and spaced a bottom plate distance from the semiconductor base substrate and projecting a first bottom plate footprint vertically relative to the semiconductor base substrate, and a first planar rectangular metal top plate above and parallel to the first metal bottom plate and separated from the first bottom plate by the dielectric material, the first planar rectangular metal top plate parallel to and spaced a top plate distance from the semiconductor base substrate that is greater than the bottom plate distance, the first rectangular top plate smaller than the first rectangular bottom top plate and aligned to fit entirely within the first bottom plate footprint relative to the semiconductor base substrate and to expose a first bottom plate remainder upper lateral connector surface vertically within the first bottom plate footprint to a one of the vertical-native capacitor metal layer positive port metal plates located above the first bottom plate and above the at least one dielectric material layer;

the second asymmetrical metal-insulator-metal capacitor having a second planar rectangular metal bottom plate parallel to and spaced the bottom plate distance from the semiconductor base substrate and projecting a second bottom plate footprint vertically relative to the semiconductor base substrate, and a second planar rectangular metal top plate above and parallel to the second metal bottom plate and separated from the second bottom plate by the dielectric material, the second planar rectangular metal top plate parallel to and spaced the top plate distance from the semiconductor base substrate, the second rectangular top plate smaller than the second rectangular bottom top plate and aligned to fit entirely within the second bottom plate footprint relative to the semiconductor base substrate;

forming a first bottom plate port contact vertically within the dielectric material layer and within the first bottom plate footprint that electrically connects the exposed first bottom plate remainder upper lateral connector surface to the one vertical-native capacitor metal layer positive port metal plate located vertically above the first bottom plate;

forming a first top plate port contact vertically within the at least one dielectric material layer and within the first bottom plate footprint that electrically connects the first top plate to a one of the vertical-native capacitor metal layer negative port metal plates located vertically above the first top plate and the at least one dielectric material layer and in the alternating horizontal parallel relationship with the one vertical-native capacitor metal layer positive port metal plate connected to the first bottom plate;

electrically connecting the first top plate to the second bottom plate; and electrically connecting the second top plate to the first bottom plate.

7. The design structure of claim 6, wherein the design structure comprises a netlist.

8. The design structure of claim 6, wherein the design structure resides on storage medium as a data format used for the exchange of layout data of integrated circuits.

\* \* \* \* \*